United States Patent
Kawamoto (10) Patent No.: US 7,082,062 B2
(45) Date of Patent: Jul. 25, 2006

(54) VOLTAGE OUTPUT CONTROL APPARATUS AND METHOD

(75) Inventor: Akira Kawamoto, Hekinan (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/048,841

(22) Filed: Feb. 3, 2005

(65) Prior Publication Data

US 2005/0180226 A1    Aug. 18, 2005

(30) Foreign Application Priority Data

Feb. 13, 2004    (JP)    ............... 2004-036534

(51) Int. Cl.
G11C 5/14    (2006.01)
(52) U.S. Cl. ............... 365/189.09; 365/189.05; 365/189.07; 365/227
(58) Field of Classification Search ........... 365/189.09, 365/189.05, 189.07, 189.11, 227
See application file for complete search history.

(56) References Cited

U.S. PATENT DOCUMENTS

| | | | | |
|---|---|---|---|---|
| 5,373,477 A | * | 12/1994 | Sugibayashi | ............. 365/226 |
| 5,663,911 A | * | 9/1997 | Kaneko | ............. 365/189.11 |
| 6,266,284 B1 | * | 7/2001 | Kurihara et al. | ....... 365/189.05 |

FOREIGN PATENT DOCUMENTS

| | | |
|---|---|---|
| JP | A-H05-292734 | 11/1993 |
| JP | A-2003-123495 | 4/2003 |

* cited by examiner

*Primary Examiner*—Tuan T. Nguyen
*Assistant Examiner*—Pho M. Luu
(74) *Attorney, Agent, or Firm*—Posz Law Group, PLC

(57) ABSTRACT

When the output of a boosted voltage is started by a boosted voltage generation circuit, the voltage supplied to memory cells and level shift circuits side through a current mirror circuit is detected by a voltage divider circuit. Comparators compare the detected voltage with a reference voltage. Based on the result of comparison, FETs are brought into conduction as required. The rate of voltage rise provided by the current mirror circuit is thus controlled.

9 Claims, 6 Drawing Sheets

VOLTAGE OUTPUT CONTROL APPARATUS AND METHOD

CROSS REFERENCE TO RELATED APPLICATION

This application is based on and incorporates herein by reference Japanese Patent Application No. 2004-36534 filed on Feb. 13, 2004.

FIELD OF THE INVENTION

The present invention relates to an apparatus and a method for controlling the rate of voltage rise when the output of supply voltage is started by a power circuit and the voltage is provided with a predetermined rate of rise before being supplied to a load side.

BACKGROUND OF THE INVENTION

A charge pump circuit generates a boosted voltage required when data is written into memory cells or erasing data from memory cells. This exemplary circuit is disclosed in JP-A-5-292734. This circuit uses an oscillation circuit so that, even when the supply voltage of a charge pump circuit fluctuates, the DC-DC conversion efficiency do not vary or the time it takes for the output voltage to reach a certain level of boosted voltage does not vary.

In a semiconductor device containing a charge pump circuit or memory cells, it is considerably possible that the leakage of a current occurs even in transistors connected externally of the charge pump circuit, memory cells or the like. When current leakage occurs, the time required for the output voltage of the charge pump circuit to rise to a certain boosted voltage can become longer than expected.

When the rise time to the boosted voltage becomes longer, for example, the time of boosted voltage application is shortened and data can be inadequately written at the time of writing data into memory cells. Such a memory IC is inevitably determined defective.

One of possible countermeasures for coping with such a problem is to proactively set the boosted voltage to be a little higher than normal. However, when the boosted voltage is set to be a little higher, the withstand voltage of transistors must be accordingly set to be a little higher. With respect to supply voltage fluctuation the in charge pump circuit, this is effective and can suppress its influence. However, this means cannot cope at all with cases where current leakage occurs in components external to the charge pump circuit.

SUMMARY OF THE INVENTION

The present invention has an object to provide an apparatus and a method for voltage output control, wherein even when current leakage occurs in a load side (load), the time it takes for the output voltage of a power circuit to reach a certain voltage can be stabilized.

According to a voltage output control apparatus and method of the present invention, when an output of supply voltage is started by a power circuit, the voltage supplied to a load is detected through a buffer circuit. Based on the result of comparison of the detected voltage with a reference voltage, the rate of voltage rise provided by the buffer circuit is controlled. Therefore, even when the state of current leakage on the load fluctuates, control is carried out so that the rate of voltage rise provided by the buffer circuit will get close to a desired setting.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
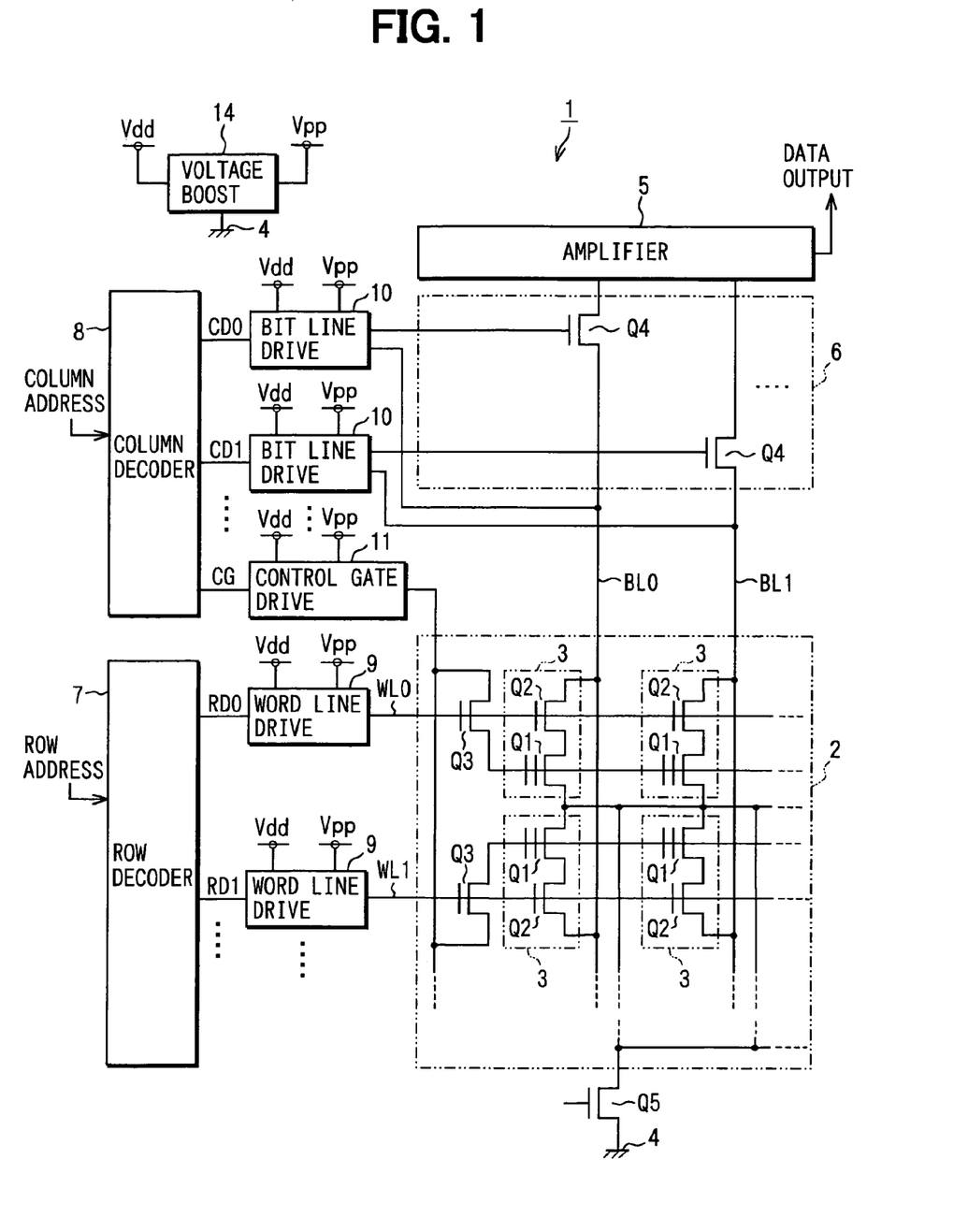
FIG. 1 is a circuit diagram illustrating an EEPROM to which a first embodiment of the present invention is applied.

Referring first to FIG. 1, an EEPROM (memory IC) 1 has a memory cell array 2 including a plurality of memory cells 3 arranged in a matrix pattern. Each memory cell 3 comprises a memory transistor Q1 having a floating gate and a selector transistor Q2. The gates of the individual selector transistors Q2 arranged in the direction of row are connected to common word lines WL0 (WL1, . . . ). The drains of the individual selector transistor Q2 arranged in the direction of column are connected to common bit lines BL0 (BL1, . . . ).

The gates (control gates) of the memory transistors Q1 arranged in the direction of row are connected to the sources of the transistors Q3 provided for each row in common. The gates of the transistors Q3 are connected to the respective word lines WL0 (WL1, . . . ). The sources of the memory transistors Q1 are connected in common, and the common sources are commented to a ground 4 through a transistor Q5.

A sense amplifier 5 is provided with current sense amplifiers (not shown) whose number is equal to the number of the bit lines. In data read operation, the sense amplifier 5 outputs data of the corresponding number of bits. Transistors Q4, Q4, . . . that form a column selector 6 are placed in the bit lines BL0, BL1, . . . between the sense amplifier 5 and the memory cell array 2.

When data is written, erased or read, a row decoder 7 and a column decoder 8 are respectively supplied with row address and column address from an address buffer (not shown). The row decoder 7 outputs row decode signals RD0, RD1, . . . , and word line drive circuits 9 output voltages corresponding to the row decode signals RD0 (RD1, . . . ) to the word lines WL0 (WL1, . . . ).

The column decoder 8 outputs column decode signals CD0, CD1, . . . . Bit line drive circuits 10 output voltages corresponding to the column decode signals CD0 (CD1, ... ) to the bit lines BL0 (BL1, ... ) and the gates of the transistors Q4. The column decoder 8 outputs control gate driving signals CG. A control gate drive circuit 11 outputs voltage corresponding to the control gate driving signal CG to the drains of the transistors Q3.

When data is written into or erased from the memory cells 3, the EEPROM 1 requires high voltage (writing voltage). This high voltage is supplied from the word line drive circuits 9, the bit line drive circuits 10 and the control gate drive circuit 11, which have the similar construction.

Figure 2:
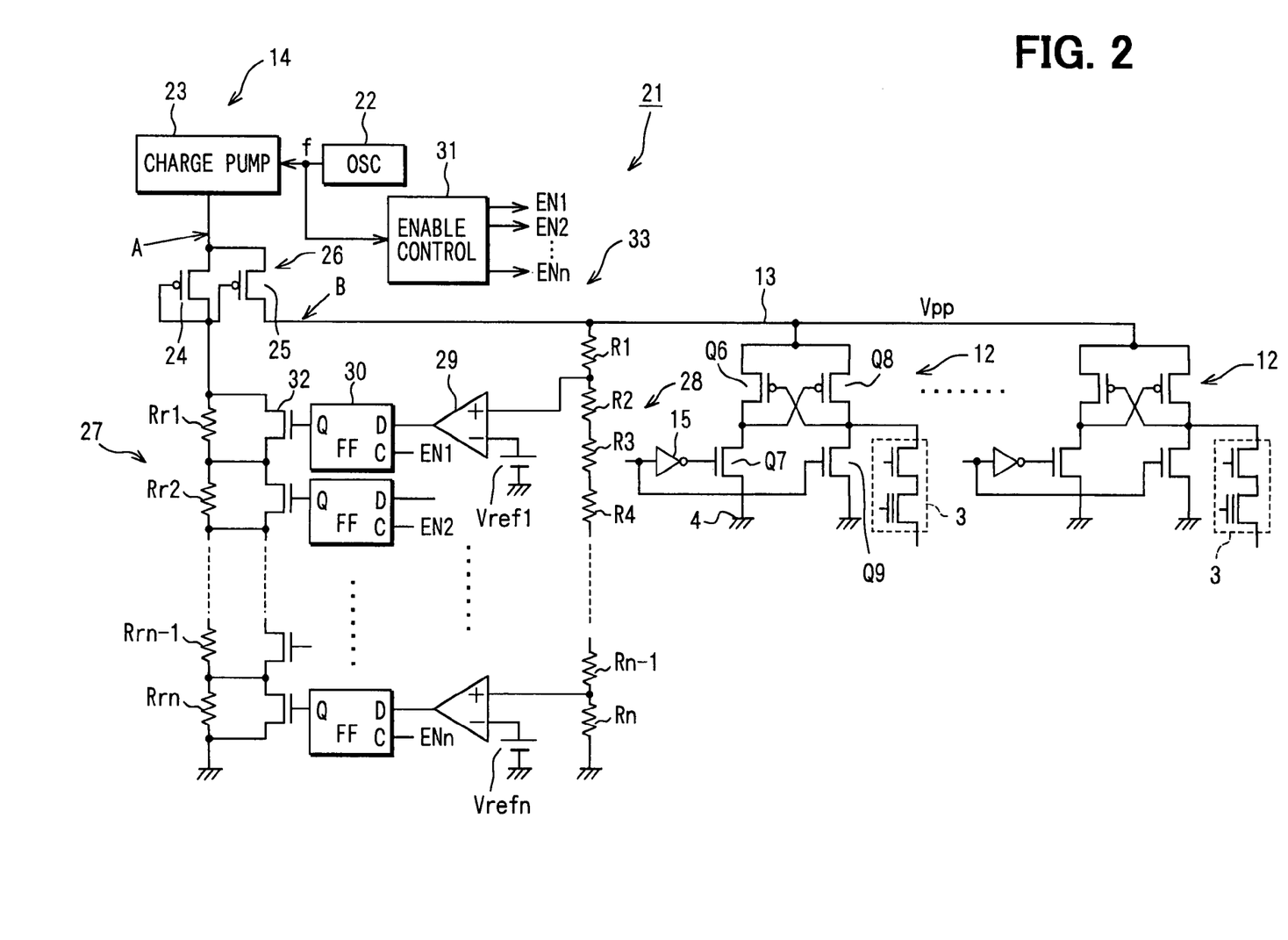
FIG. 2 is a circuit diagram illustrating a boosted voltage generation circuit and a voltage output control circuit in the EEPROM in the first embodiment.

For instance, the word line drive circuit 9 includes, as illustrated in FIG. 2, level shift circuits 12 for outputting such a high voltage, a boosted voltage generation circuit (power circuit) 14 that supplies a boosted voltage Vpp to the level shift circuits 12 through a power line 13, and a voltage output control circuit 21 that controls the rate of voltage rise when the supply of the boosted voltage Vpp is started.

Transistors Q6, Q7 and transistors Q8, Q9 in each level shift circuit 12 are respectively connected in series between the power line 13 and ground 4. The gates of the transistors Q6 and Q8 are respectively connected to the drains of the transistors Q9 and Q7. The gate of the transistor Q7 is supplied with the row decode signal RD0 (RD1, ... ). The gate of the transistor Q9 is supplied with signals obtained by the row decode signal RD0 (RD1, ... ) being inverted by an inverter 15.

With boosted voltage Vpp supplied to the power line 13, the level shift circuit 12 outputs boosted voltage Vpp when the row decode signal RD0 (RD1, ... ) is at the HIGH level and 0V when the row decode signal RD0 (RD1, ... ) is at the LOW level. The power line 13 is connected with a large number of the same level shift circuits 12 and memory cells 3.

The boosted voltage generation circuit 14 may be in a well-known circuit construction (e.g., JP-A-2003-123495). For instance, it may be a combination of an oscillation circuit 22 and a charge pump circuit 23. The voltage output terminal of the charge pump circuit 23 is connected with a current mirror circuit (buffer circuit) 26 comprising a pair of p-channel MOSFETs 24 and 25. That is, the sources of the FETs 24 and 25 are connected to the above voltage output terminal in common, and the drain of the FET 24 is connected to ground through a series resistor circuit 27.

The series resistor circuit 27 is formed by connecting a plurality of resistance elements Rr1 to Rrn in series. The drain of the FET 25 is connected to the power line 13, and the gates of the FETs 24 and 25 are connected to the drain of the FET 24 in common.

The power line 13 is connected to ground through a voltage divider circuit 28 for voltage detection. The voltage divider circuit 28 is formed by connecting a plurality of resistance elements R1 to Rn in series. In the voltage divider circuit 28, the common junction point between the resistance elements Rn-1 and Rn is connected with the non-inverting input terminal of a comparator 29(1 to n, comparator group) in common. The inverting input terminals of the comparators 29(1 to n) are respectively connected with reference voltages Vref(1 to n). The reference voltages Vref(1 to n) are generated, for example, by dividing power 5V for operating the comparators 29 stepwise. The reference voltages Vref(1 to n) are set so that the following expression will hold: $0 < Vref(1 \text{ to } n) \leq 5V$.

The output terminals of the comparators 29(1 to n) are respectively connected to the D input terminals of D flip-flops 30(1 to n, enable circuit group). The clock (C) input terminals of the D flip-flops 30(1 to n) are respectively supplied with enable signals EN(1 to n) outputted by an enable control circuit 31.

Figure 3:
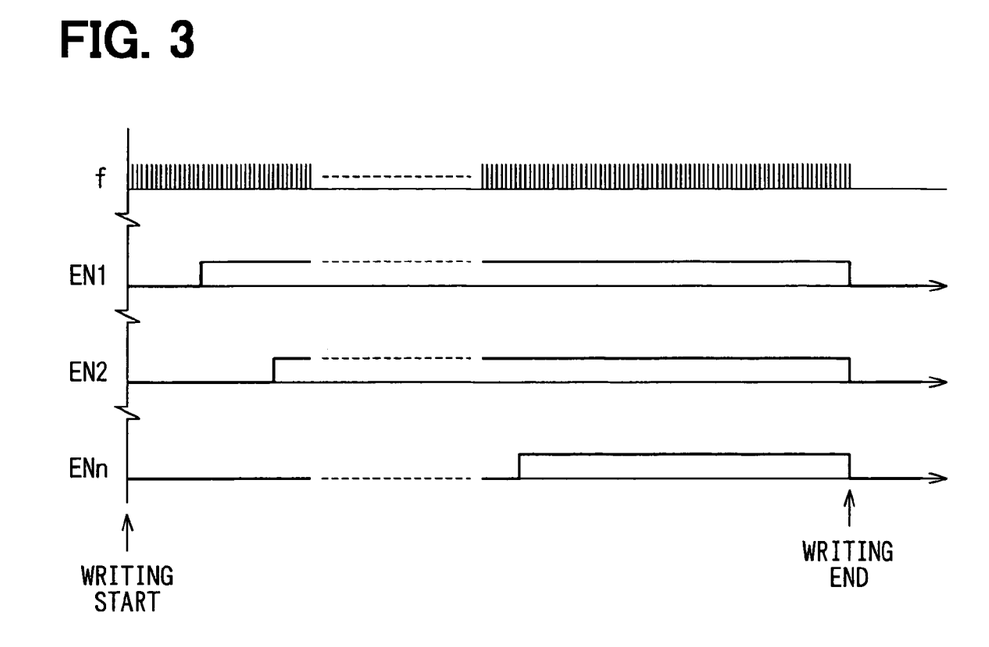
FIG. 3 is a timing diagram of a clock signal and enable signals outputted from an enable control circuit in the first embodiment.

The enable control circuit 31 comprises a counter and a decoder, and counts the number of inputted clock signals f, outputted by the oscillation circuit 22. As shown in FIG. 3, when the count value becomes equal to a value set on the decoder, the enable control circuit 31 drives the enable signals EN(1 to n) active (high) in sequence.

The Q output terminals of the D flip-flops 30(1 to n) are connected to the gates of n-channel MOSFETs 32(1 to n, switching element group). The drains and sources of the FETs 32(1 to n) are respectively connected to both ends of the resistance elements Rr1 to Rrn that form the voltage divider circuit 27. The above components form the voltage output control circuit 21. The series resistor circuit 27, comparators 29, D flip-flops 30, enable control circuit 31 and FETs 32 form a controlling part 33.

In operation, when the EEPROM 1 is not performing data writing operation or data erasing operation, the charge pump circuit 23 does not perform boosting operation. Meanwhile, when a write instruction or an erase instruction is inputted to the EEPROM 1 and address decode signals are outputted from the row decoder 7 and the column decoder 8, the clock signal f that is outputted by the oscillation circuit 22 is supplied. As a result, the charge pump circuit 23 starts boosting operation.

When the boosted voltage Vpp exceeds a target voltage during this boosting operation, the supply of the clock signal f from the oscillation circuit 22 to the charge pump circuit 23 is temporarily stopped. Thus the boosted voltage Vpp is so controlled that it will decrease to the predetermined target voltage. The boosted voltage Vpp is outputted to the power line 13 through the current mirror circuit 26. The ground-side potential of the FET 24 forming the current mirror circuit 26 linearly rises due to the current flowing to the series resistor circuit 27 through the FET 24. As a result, the potential of the power line 13, positioned on the other side of the mirror pair, also rises in conjunction therewith.

Figure 4:
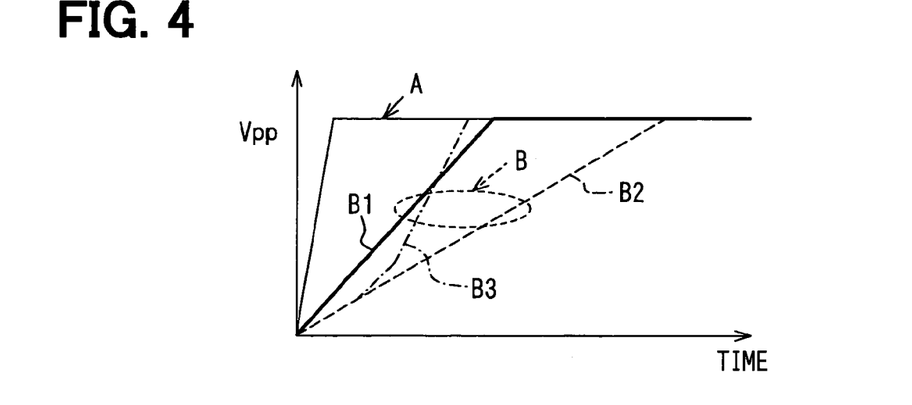
FIG. 4 is a characteristic diagram of a current mirror circuit and the voltage output control circuit in the first embodiment.

Here, with respect to the waveform at the voltage output terminal A of the charge pump circuit 23, the following is assumed: the ideal voltage rise gradient in the power line 13 (point B), obtained by the action of the current mirror circuit 26, is as indicated by a heavy solid line B1 in FIG. 4. However, when current leakage is present in the memory cells 3 or the FETs forming the level shift circuits 12 (load), the actual voltage rise gradient differs from this. The rise gradient becomes gentle as indicated by a broken line B2 in FIG. 4. As a result, it takes a longer time for the boosted voltage Vpp in the power line 13 to reach the target voltage.

In this case, various problems arise. For example, when operation of writing into the memory cells 3 is performed, the time of application of the boosted voltage Vpp is shortened, and data writing will become incomplete.

To eliminate this lengthening of time, the voltage output control circuit 21 operates as follows. When the potential of the power line 13 transitionally rises, the divided potential in the voltage divider circuit 28 also rises. Then the comparators 29(1 to n) compare the divided potential with the reference voltages Vref(1 to n) in a plurality of stages. The output signals of the comparators 29 are respectively outputted to the gates of the FETs 32(1 to n) with the timing at which the enable control circuit 31 outputs the enable signals EN(1 to n) (on the rising edge).

When the divided potential is lower than the reference voltage Vref, the potential rise gradient of the power line 13 becomes gentler than the ideal gradient B1 as indicated by a one-dot-chain line B3 in FIG. 4. At this time, the comparators 29 output signals of the HIGH level, and the flip-flops 30 output gate signals of the HIGH level to the gates of the FETs 32 on the rising edges of the enable signals EN. Consequently, the FETs 32 are brought into conduction, and the corresponding resistance elements R forming the series resistor circuit 27 are short-circuited.

Therefore, the series resistance value of the series resistor circuit 27 is apparently lowered, and the current supplying capability of the current mirror circuit 26 is increased. As a result, the potential rise gradient of the power line 13 varies and becomes steeper as indicated by the line B3.

When the divided potential is higher than the reference voltage Vref, the comparators 29 output signals of the LOW level, and thus the FETs 32 are not brought into conduction.

That is, the results of comparison by the comparators 29(1 to n) are respectively outputted to the gates of the FETs 32 through the flip-flops 30(1 to n) when the rising edges of the enable signals EN (1 to n) are provided. As a result, the rise gradient of the boosted voltage Vpp in the power line 13 varies so as to follow the ideal line B1 of gradient, as indicated by the line B3 in FIG. 4. When the write operation or erase operation of the EEPROM 1 is terminated, the flip-flops 30 are reset.

As mentioned above, when the output of boosted voltage Vpp is started by the boosted voltage generation circuit 14, the voltage supplied to the memory cells 3 and the level shift circuit 12 through the current mirror circuit 26 is detected through the voltage divider circuit 28. Based on the result of comparison of the detected voltage with the reference voltage Vref, the controlling part 33 controls the rate of voltage rise given by the current mirror circuit 26.

Therefore, even when the state of current leakage on the load fluctuates, control is carried out so that the rate of voltage rise given by the current mirror circuit 26 will get close to a desired setting. Further, not only the influence of leakage currents but also fluctuation in the rate of voltage rise due to change in supply voltage or the temperature of operating environment can be suppressed. Even when high-level voltage is applied, a constant current can be passed by the current mirror circuit 26 when power is supplied to the load. Therefore, the gradient can be given so that the voltage level will be gradually increased.

The controlling part 33 performs the following until the voltage supplied to the load rises to a predetermined supply voltage: it compares the voltage detected through the voltage divider circuit 28 with the reference voltages Vref(1 to n) in a plurality of stages, and controls the rate of temperature rise. Therefore, this control can be more finely carried out. Further, the controlling part 33 adjusts the current supplying capability of the current mirror circuit 26. Thus the rate of rise in the voltage supplied to the load can be adjusted.

Further, the output signals of the comparators 29 are outputted to the FETs 32 through the flip-flops 30 that latches and produces output on the edges of enable signals. Therefore, the levels of the output signals of the comparators 29 can be held with the timing at which the enable signal is outputted, and the resistance elements R can be easily kept in short-circuited state.

In addition, the present invention is applied to the boosted voltage generation circuit 14 for use in the EEPROM 1. Therefore, control can be carried out so that the rise time of boosted voltage Vpp required for writing or erasing data into or from the memory cells 3 will be substantially constant. Thus, writing operation and erasing operation can be performed with stability. Therefore, the yield of the EEPROM 1 can be enhanced without setting the boosted voltage Vpp a little too high.

Second Embodiment

Figure 5:
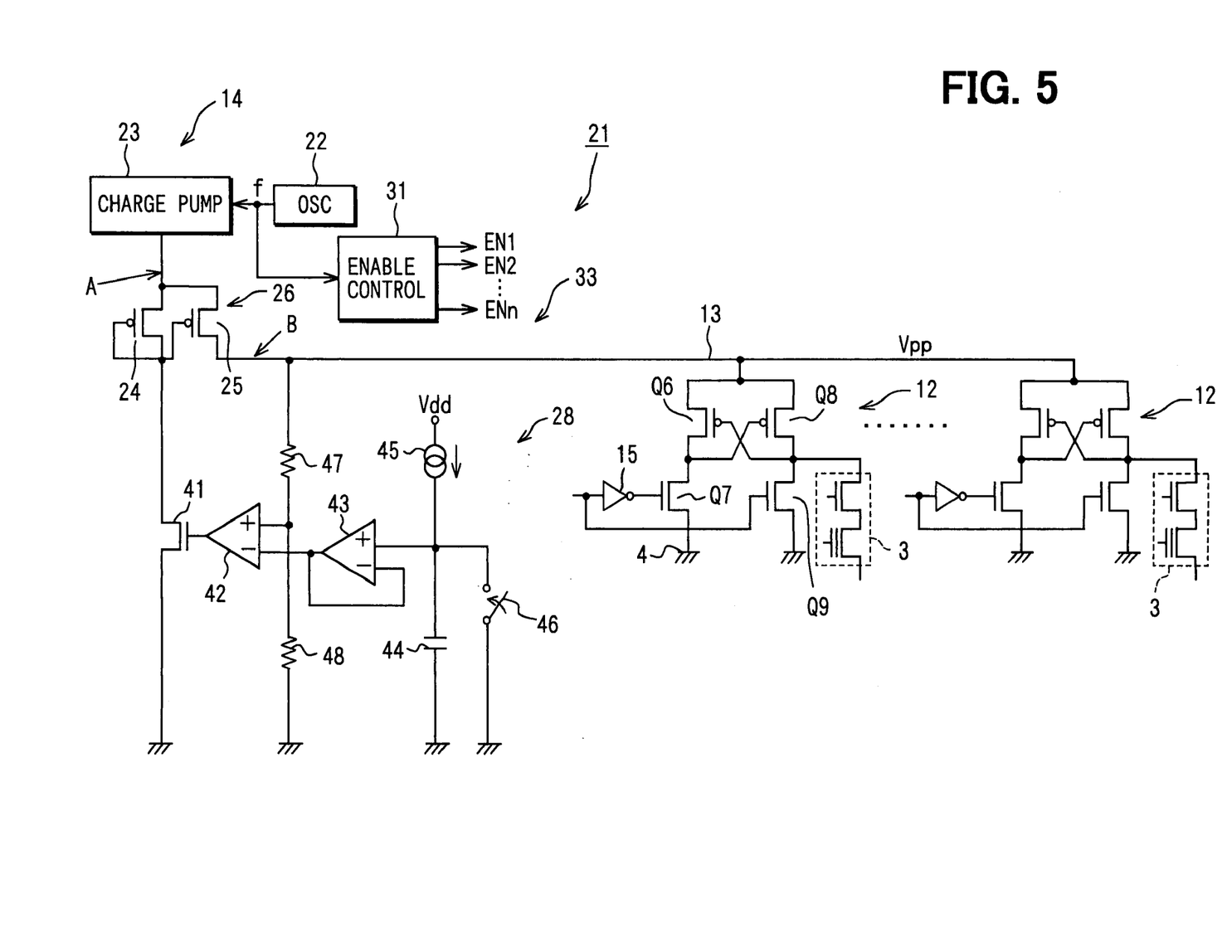
FIG. 5 is a circuit diagram illustrating a boosted voltage generation circuit and a voltage output control circuit in the EEPROM in a second embodiment of the present invention.

In a second embodiment, as shown in FIG. 5, the controlling part 33 is constructed with a FET 41, a comparator 42, an amplifier 43, a capacitor 44, a constant current source 45, a switch 46 and resistors 47 and 48. The capacitor 44 is charged with a constant current supplied from the current source 45 after the switch 46 opens to start the voltage supply to the load. The amplifier 43 responsively produces a voltage indicative of a target voltage as a reference, which increases linearly, that is, at a fixed voltage rising rate. A divided voltage of the voltage Vpp detected by the resistors 47 and 48 is compared by the comparator 42 with the output voltage of the amplifier 43. The comparator 42 controls the conduction of the FET 41 in response to its comparison result so that the current flowing in the FET 26 is determined based on the on-resistance of the FET 41. Thus, the voltage Vpp correspondingly increases linearly with the voltage of the amplifier 43.

Third Embodiment

Figure 6:
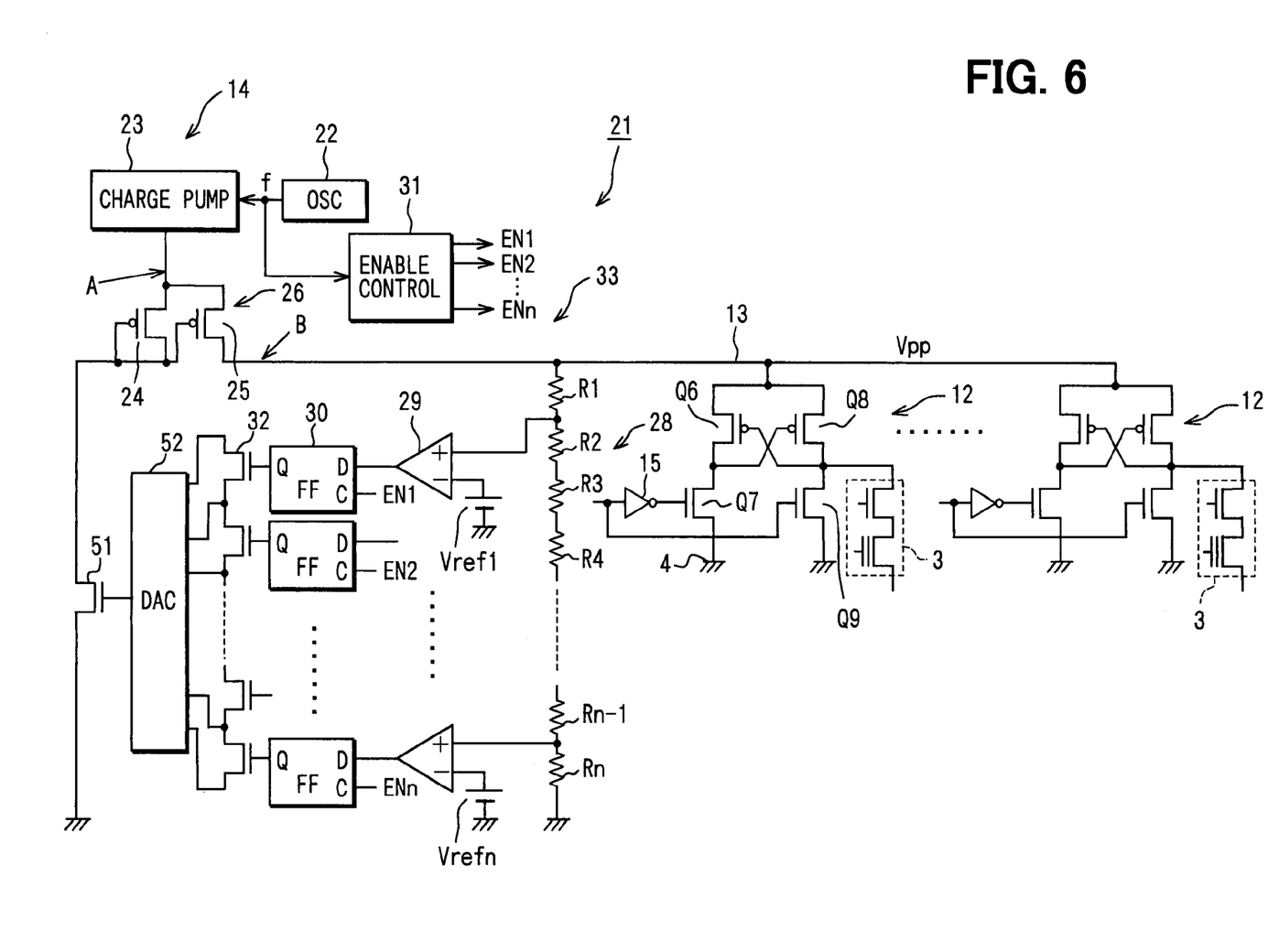
FIG. 6 is a circuit diagram illustrating a boosted voltage generation circuit and a voltage output control circuit in the EEPROM in a third embodiment of the present invention.

In a third embodiment, as shown in FIG. 6, the controlling part 33 includes a FET 51 and a digital-to-analog converter 52 in place of the series resistor circuit 27 of the first embodiment (FIG. 2). The converter 52 converts the output signals of the flip-flops 30 to an analog signal, which in turn controls the conduction of the FET 51 so that the current flowing in the FET 26 is determined based on the on-resistance of the FET 51.

Fourth Embodiment

Figure 7:
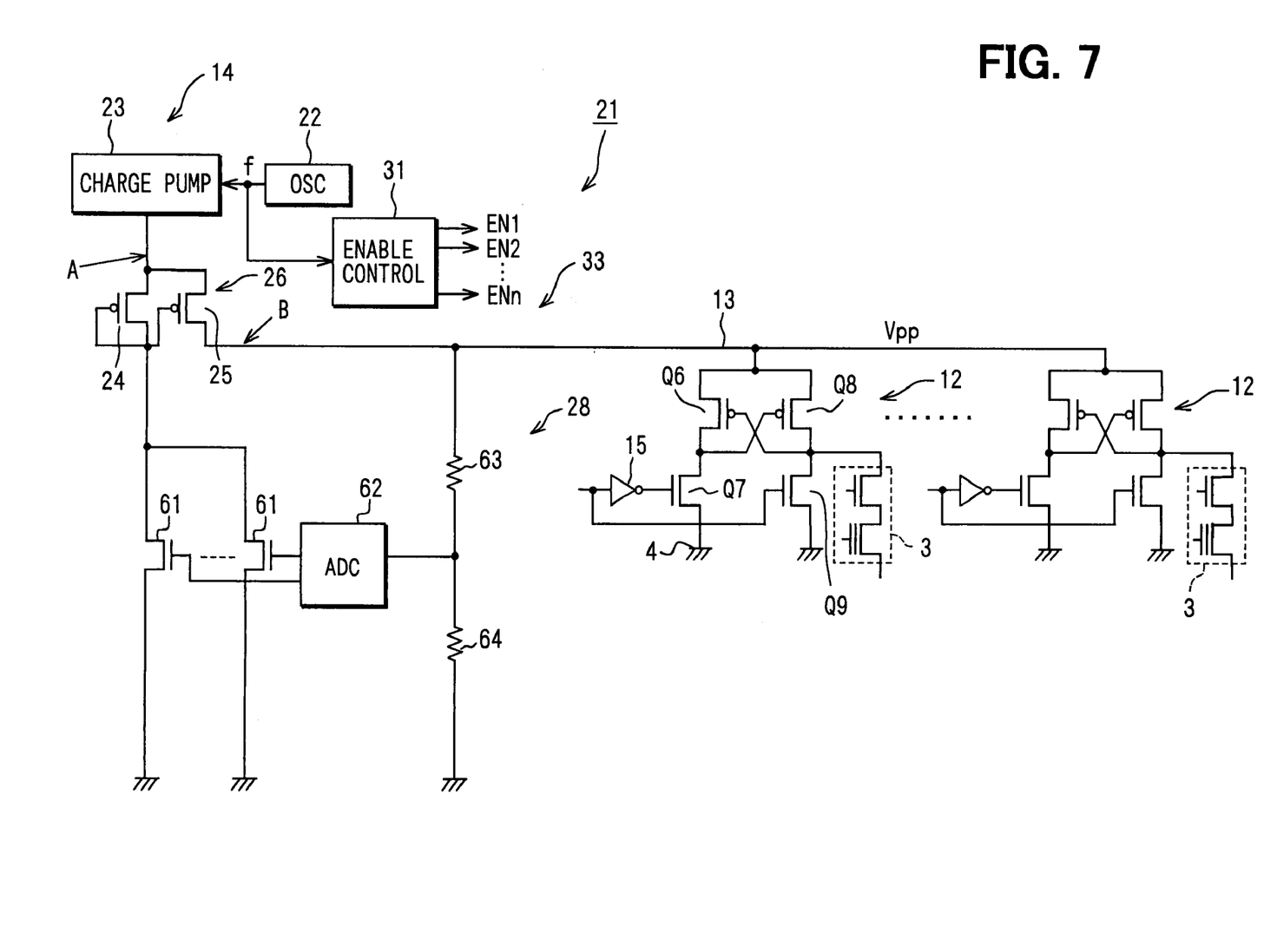
FIG. 7 is a circuit diagram illustrating a boosted voltage generation circuit and a voltage output control circuit in the EEPROM in a fourth embodiment of the present invention.

In a fourth embodiment, as shown in FIG. 7, the controlling part 33 is constructed with FETs 61 connected in parallel, an analog-to-digital converter (ADC) 62, and resistors 63 and 64 connected in series. The converter 62 converts the voltage Vpp on the line 13 to digital signals. These digital signals control the FETs 61, that is, the number of FETs 61 to be turned on in accordance with the voltage Vpp. Thus, the current flowing in the FET 26 is determined based on the number of FETs 61 turned on.

The above embodiments may further be modified in many ways.

For instance, the number of the elements forming the series resistor circuit and the number of the elements forming the voltage divider circuit need not be equal to each other.

The voltage divider circuit may be constructed of a series capacitor circuit.

The controlling part may carry out control by comparing a detected voltage with a single reference voltage in the process of raising voltage on the load.

The buffer circuit need not be a current mirror circuit 26, and may be constructed with capacitors and the like.

The enable circuits need not be flip-flops 30, and may be anything as long as it outputs the result of comparison by the comparators 29 to the gates of the FETs 32 with the timing with which enable signals are outputted.

The number of element connections of the series resistor circuit 27 and the number of element connections of the voltage divider circuit 28 need not be equal to each other.

The switching elements need not be n-channel FETs 32 and may be p-channel FETs, bipolar transistors, IGBTs, or the like.

The above embodiments should not be limited to a boosted voltage generation circuit in a memory IC, and is applicable to other common boosted voltage generation circuits. The power circuit need not be a boosted voltage generation circuit, but may be applied to stabilized power circuits and the like.

What is claimed is:

1. A voltage output control apparatus comprising:
   a buffer circuit that, when an output of a supply voltage is started by a power circuit, provides a predetermined rate of rise to the voltage and supplies the voltage to a load;
   a voltage detecting means that detects the voltage supplied to the load through the buffer circuit; and
   a controlling means that operates to control the rate of voltage rise based on a result of comparison of the voltage detected by the voltage detecting means with a reference voltage,
   wherein the controlling means compares the voltage detected by the voltage detecting means with reference voltages in a plurality of stages to control the rate of voltage rise until the voltage supplied to the load rises to a predetermined supply voltage,
   wherein the buffer circuit comprises a current mirror circuit in which one side of a mirror pair is connected to ground through a series resistor circuit and the other side of the mirror pair is connected to the load, and
   wherein the voltage detecting means includes a voltage divider circuit connected between the other side of the mirror pair and ground.

2. The voltage output control apparatus according to claim 1, wherein the controlling means includes:
   comparators that respectively compare a potential divided through the voltage divider circuit with reference potentials in a plurality of stages;
   enable circuits that output output signals of the comparators when enable signals are supplied;
   a plurality of switching elements control terminals of which are connected to output terminals of the enable circuits and output terminals of which are respectively connected to both ends of a plurality of resistance elements forming the series circuit; and
   an output means that outputs enable signals to the enable circuits with individually different timing.

3. The voltage output control apparatus according to claim 2, wherein the enable circuits include flip-flops that latch and output the output signals of the comparators on edges of the enable signals.

4. The voltage output control apparatus according to claim 1, wherein the power circuit is a boosted voltage generation circuit that generates boosted voltage required when data is written into memory cells or data is erased from the memory cells.

5. A voltage output control method for controlling an output of a supply voltage, which is supplied from a power circuit to a load, the voltage output control method comprising:
   detecting the supply voltage;
   setting a predetermined rate of rise of the supply voltage; and
   controlling the supply voltage to vary in the predetermined rate of rise,
   wherein the controlling includes varying a constant current supplied from a constant current circuit to the load.

6. The voltage output control method according to claim 5, wherein the controlling includes comparing the detected supply voltage with reference voltages in a plurality of stages having the predetermined rate of rise and varying the supply voltage in response to a comparison result.

7. A voltage output control method for controlling an output of a supply voltage, which is supplied from a power circuit to a load, the voltage output control method comprising:
   detecting the supply voltage;
   setting a predetermined rate of rise of the supply voltage;
   controlling the supply voltage to vary in the predetermined rate of rise; and
   generating a boosted voltage required when data is written into memory cells as the load and data is erased from the memory cells,
   wherein the boosted voltage is supplied as the supply voltage, and
   wherein the controlling includes:
      supplying from a constant current circuit a constant current determined by the boosted voltage to provide the supply voltage; and
      varying a resistance connected in series with the constant current circuit based on a relation between the detected supply voltage and the predetermined rate of rise, thereby varying the supply voltage, the supply voltage being supplied from a junction between the constant current circuit and the resistance.

8. The voltage output control method according to claim 7, wherein the varying includes changing the number of FETs connected in series with the constant current circuit.

9. The voltage output control method according to claim 7, wherein the varying includes changing an on-resistance of a FET connected in series with the constant current circuit.

* * * * *